United States Patent [19]

Fandrich et al.

[11] Patent Number: 5,692,138
[45] Date of Patent: Nov. 25, 1997

[54] FLEXIBLE USER INTERFACE CIRCUIT IN A MEMORY DEVICE

[75] Inventors: Mickey L. Fandrich, Placerville; Richard J. Durante, Citrus Heights; Rodney R. Rozman, Placerville, all of Calif.

[73] Assignee: Intel Corporation, Santa Clara, Calif.

[21] Appl. No.: 754,104

[22] Filed: Nov. 21, 1996

Related U.S. Application Data

[63] Continuation of Ser. No. 350,380, Dec. 5, 1994, abandoned, which is a continuation of Ser. No. 85,587, Jun. 30, 1993, abandoned.

[51] Int. Cl.⁶ .................................. G06F 12/00; G06F 13/00
[52] U.S. Cl. ...................... 395/310; 395/430; 365/189.05
[58] Field of Search .................................. 395/309, 310, 395/430, 412; 365/189.05, 218

[56] References Cited

U.S. PATENT DOCUMENTS

| | | | |
|---|---|---|---|
| 4,680,701 | 7/1987 | Cochran | 364/200 |
| 5,045,967 | 9/1991 | Igarashi | 364/518 |
| 5,053,990 | 10/1991 | Kreifels et al. | 395/425 |
| 5,058,037 | 10/1991 | Kageyama et al. | 364/519 |
| 5,065,364 | 11/1991 | Atwood et al. | 365/185 |
| 5,159,672 | 10/1992 | Salmon et al. | 395/325 |
| 5,177,745 | 1/1993 | Rozman | 371/21.1 |
| 5,222,046 | 6/1993 | Kreifels et al. | 365/230.06 |
| 5,224,070 | 6/1993 | Fandrich | 365/185 |
| 5,233,559 | 8/1993 | Brennan, Jr. | 365/200 |
| 5,245,572 | 9/1993 | Kosonocky et al. | 365/189 |
| 5,249,158 | 9/1993 | Kynett et al. | 365/230 |
| 5,265,059 | 11/1993 | Wells et al. | 365/204 |
| 5,297,148 | 3/1994 | Harari et al. | 371/10.2 |

*Primary Examiner*—Gopal C. Ray
*Attorney, Agent, or Firm*—Blakely, Sokoloff, Taylor & Zafman

[57] ABSTRACT

A flash memory device having a flash cell array comprising a plurality of flash cells, a flash array controller circuit for performing program and erase operations on the flash cell array according to a queue operation, and an interface circuit for generating the queue operation according to a user command and a set of command parameters received over a host bus. The interface circuit determines a set of limited resource control bits for the user command and queues the user command and associated parameters to the flash array controller circuit.

45 Claims, 10 Drawing Sheets

FLEXIBLE USER INTERFACE CIRCUIT IN A MEMORY DEVICE

This is a continuation of application Ser. No. 08/350,380, filed Dec. 5, 1994, now abandoned which is a continuation of application Ser. No. 08/085,587, filed Jun. 30, 1993, now abandoned.

BACKGROUND OF THE INVENTION

1. Field of the Invention

The present invention pertains to the field of integrated circuit memory devices. More particularly, this invention relates to a flexible user interface circuit for a memory device.

2. Art Background

A flash memory device contains a flash cell array for nonvolatile random access data storage in a computer system. Prior flash memory devices usually implement a write control circuit for programming and erasing areas of the flash cell array. The write control circuit typically programs the flash cells by applying a predetermined sequence of program level voltages to the flash cells.

In systems employing such prior flash memory devices, a user typically provides an input/output driver that issues user commands to the flash memory devices. The user commands commonly include commands for programming and erasing portion of the flash array. The write control circuit receives and verifies the user commands, and performs the specified program or erase operation on the flash array.

Unfortunately, such prior flash memory devices typically cannot accept user commands while executing a previous user command. For example, such a prior flash memory device cannot accept a user command for a program operation while the write control circuit is busy performing an erase operation for a previous user command. As a consequence, a time consuming erase operation blocks out other operations targeted for the flash memory device, and reduces overall throughput to the flash memory device.

SUMMARY AND OBJECTS OF THE INVENTION

One object of the present invention is to provide a flexible user interface circuit for a flash memory device, wherein the user interface circuit queues operations to a flash array controller for the memory device.

Another object of the present invention is to provide a flexible user interface circuit for a flash memory device, wherein the user interface circuit allocates limited resources to user commands transferred to the flash array controller.

Another object of the present invention is to enable the flash array controller to select either a primary queue operation or a secondary queue operation from the interface circuit.

A further object of the present invention is to convert user commands into an offset value that specifies an entry in a command processing routine jump table in code storage for the flash array controller, such that the offset value is transferred to the flash array controller through the operation queues and enables the flash array controller to dispatch to the proper command processing routine.

These and other objects of the invention are provided by a flash memory device having a flash cell array comprising a plurality of flash cells, a flash array controller circuit for performing program and erase operations on the flash cell array according to a queue operation, and an interface circuit for generating the queue operation according to a user command and a set of command parameters received over a host bus. The interface circuit determines a set of limited resource control bits for the user command and queues the user command, the parameters, and the limited resource control bits to the flash array controller circuit over a queue bus.

The interface circuit comprises a temporary queue circuit for temporarily storing the queue operation, and an operation queue circuit having queue slots for a primary queue operation and a secondary queue operation. The flash array controller selectively accesses the primary and secondary queue operations from the queue slots.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
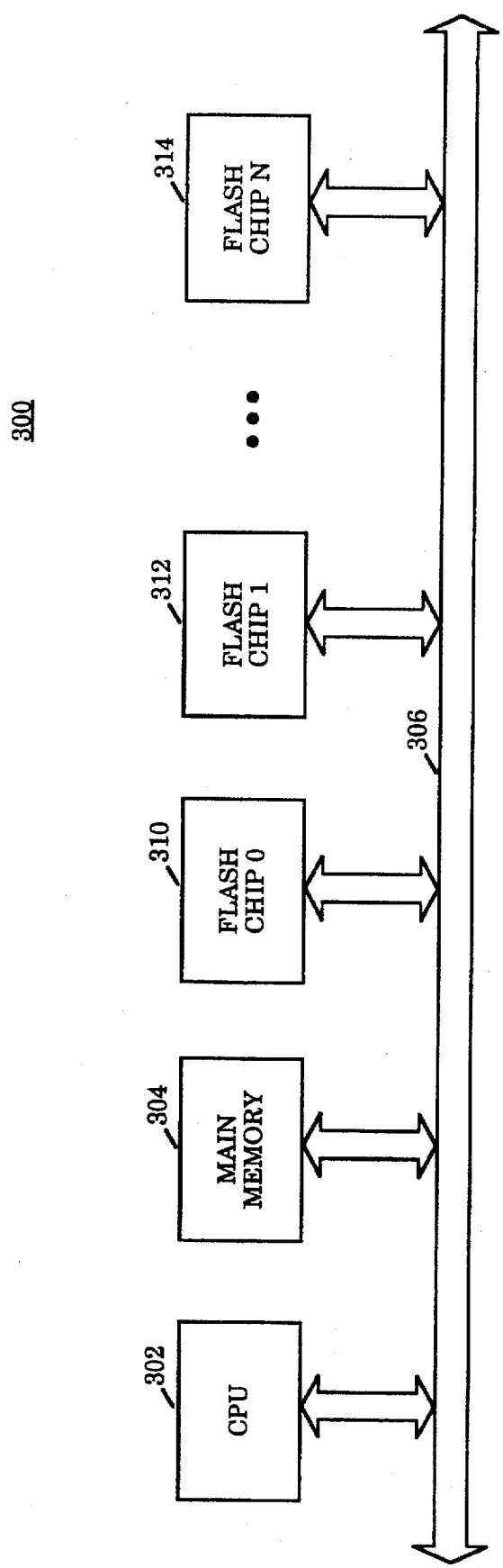
FIG. 1 is a block diagram of a computer system including a central processing unit (CPU), a main memory subsystem, and a set of flash memory devices.

FIG. 1 is a block diagram of a computer system 300. The computer system 300 is comprised of a central processing unit (CPU) 302, a main memory subsystem 304, and a set of flash memory devices 310–314. The CPU 302 communicates with the main memory subsystem 304 and the flash memory devices 310–314 over a host bus 306.

The flash memory devices 310–314 provide random access non volatile large scale data storage for the computer system 300. The CPU 302 reads the contents of the flash memory devices 310–314 by generating read memory cycles over the host bus 306. The CPU 302 writes to the flash memory devices 310–314 by transferring write commands and write data blocks to the flash devices 310–314 over the host bus 306.

Figure 2:
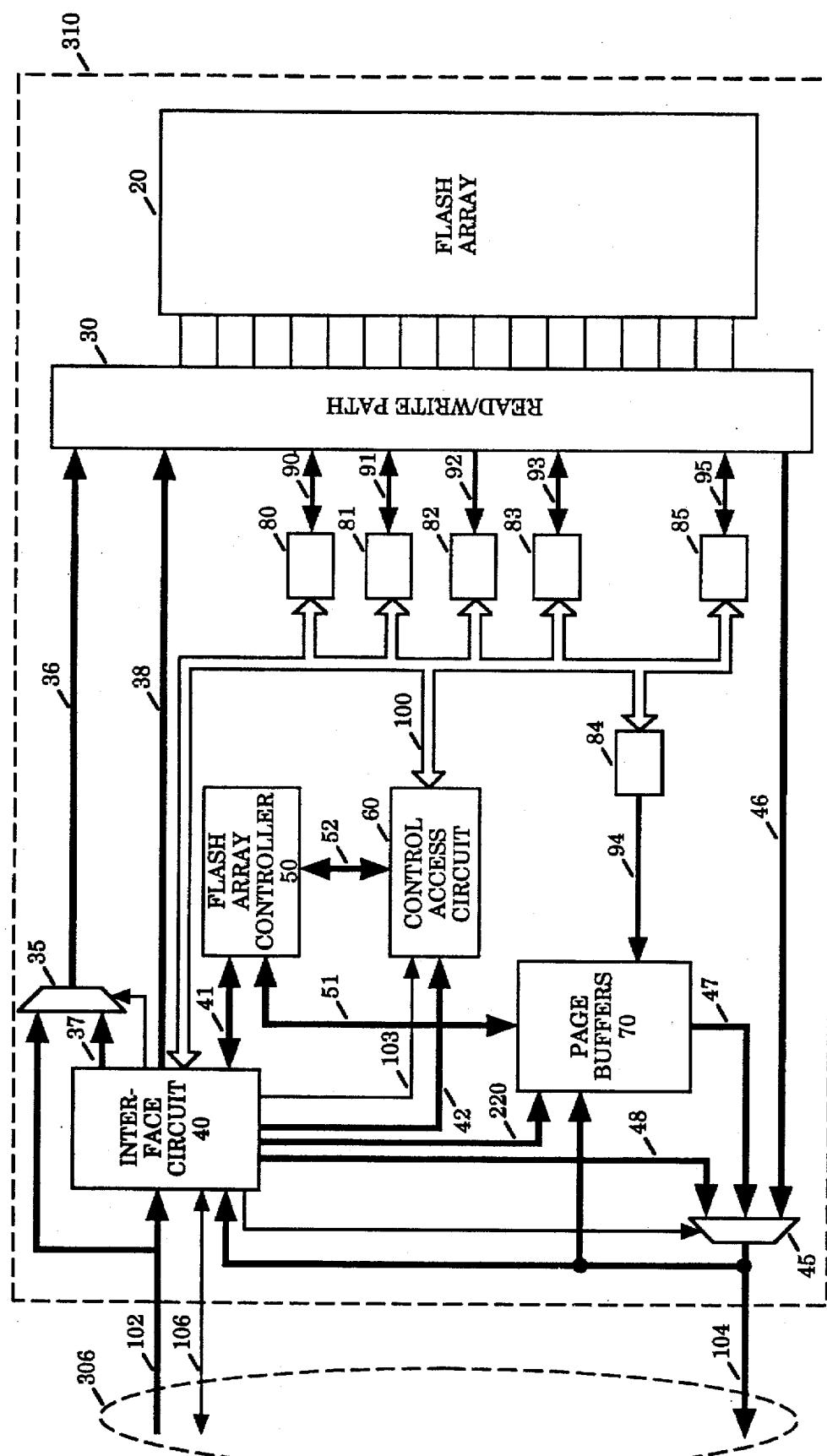
FIG. 2 is a block diagram of the flash memory device including a flash cell array, an interface circuit, a flash array controller, a set of page buffers, a set of control register circuits, and a set of read/write path circuitry.

FIG. 2 is a block diagram of the flash memory device 310. The flash memory device 310 is comprised of a flash cell array 20, an interface circuit 40, a flash array controller 50, a page buffer circuit 70, a set of control register circuits 80–85, and a set of read/write path circuitry 30.

The flash cell array 20 provides random access non volatile large scale data storage. For one embodiment, the flash cell array 20 is arranged as a set of 32 flash array blocks. Each flash array block provides 64k bytes of data storage.

The flash memory device 310 is shown coupled to the host bus 306. The host bus 306 comprises an user address bus 102, a user data bus 104, and a user control bus 106.

The read/write path circuitry 30 comprises read and write path circuitry for accessing the flash array 20. For example, the read/write path circuitry 30 includes row and column address decoding circuitry for the flash array 20. The read/write path circuitry 30 also includes redundancy circuitry for overriding addresses if a bad flash cell is detected in the flash array 20. The read/write path circuitry 30 also includes mini array circuitry for generating reference flash bits, and sense path circuitry for comparing the reference flash bits to bits from the flash array 20 to determine whether the bits are logic state 1 or logic state 0.

The read/write path circuitry 30 also includes multiplexer circuitry for selecting between bits from the flash array 20 and redundant bits, as well as multiplexer circuitry for selecting between the high and low bytes of the flash array 20 to provide for 8 bit and 16 bit accesses. The read/write path circuitry 30 includes output buffer circuitry for driving data from the flash array 20 over output pads of the flash memory device 310.

The read/write path circuitry 30 includes address transition detection circuitry. The address transition detection circuitry generates control pulses when address transitions are detected. The control pulses are employed to speed column charging at the outputs of the flash array 20 before data is ready.

The read/write path circuitry 30 includes high voltage circuitry for accessing the flash array 20. For example, the read/write path circuitry 30 includes VPX switching circuitry for setting the wordline voltage for programming data into the flash array 20, and VPY generator circuitry for setting the programming load line. The read/write path circuitry 30 also includes VSI generator circuitry for setting the source voltage of unselected blocks of the flash array 20 during programming.

The read/write path circuitry 30 also includes digital to analog conversion circuits for generating reference voltage levels for program verify operations, as well as erase verify and post erase repair operations. The read/write path circuitry 30 also includes VPS switch circuitry for setting the source voltage level to VPP during erase operations.

The read/write path 30 includes source switch circuitry for applying the appropriate voltage levels to the flash cell array 20 for an erase function. The read/write path 30 also includes program load circuitry for driving program level voltages onto the bit lines of the flash cell array 20 during a programming function.

The control register circuits 80–85 contain sets of specialized control registers and associated circuitry for controlling a read/write path 30. The specialized control registers are programmed and accessed over a central control bus 100.

The interface circuit 40 enables access of the flash array 20 over the host bus 306 by receiving and processing commands over the host bus 306. The interface circuit 40 receives commands over the user data bus 104, verifies the commands, and queues a command offset to the flash array controller 50 over a control bus 41. Thereafter, the flash array controller 50 executes the corresponding to the command offset using the appropriate portion of the flash memory device 310.

The flash array controller 50 is a specialized reduced instruction set processor for performing program, erase, and other operations on the flash array 20. The flash array controller 50 includes an arithmetic logic unit, general purpose registers, a control store and a control sequencer. The flash array controller 50 uses the command offsets received over the control bus 41 to dispatch to the appropriate location of the control store containing the routine for performing the specified operation.

The flash array controller 50 implements algorithms for sequencing the high voltage circuitry of the read/write path 30 in order to apply charge to the flash cells of the flash cell array 20 and remove charge from the flash cells of the flash cell array 20. The flash array controller 50 controls the high voltage circuitry and addresses the flash array 20 by accessing the control register circuits 80–85 over the central control bus 100.

A control access circuit 60 enables both the interface circuit 40 and the flash array controller 50 to access the control register circuits 80–85 over the central control bus 100. During a normal mode of the flash memory device 310, the flash array controller 50 controls the control access circuit 60 and accesses the control register circuits 80–85 over the central control bus 100.

The flash array controller 50 writes to the specialized control registers by transferring a write control signal, and a register address along with corresponding write data to the control access circuit 60 over a bus 52. The control access circuit 60 then generates a write cycle over the central control bus 100 to program the addressed specialized control register. The flash array controller 50 reads the specialized control registers by transferring a register address and read control signal to the control access circuit 60 over the bus 52. The control access circuit 60 then generates a read access cycle over the central control bus 100 to read the addressed specialized control register.

The control register circuit 80 contains specialized control registers and circuitry for controlling the high voltage circuitry of the read/write path 30 according to a set of control signals 90. The high voltage control registers include source switch interface registers, interface registers for controlling VPX and VPIX multiplexers, VPP/VCC switch interface registers, interface registers for controlling reference generators, multiplexers and comparators, and programming data path interface registers.

The control register circuit 81 contains control registers and circuitry for controlling special column access circuitry of the read/write path 30 according to a set of control signals 91. The special column access control registers include mini-array interface registers, redundancy interface registers, imprint interface registers, and content addressable memory interface registers.

The control register circuit 82 contains a set of read only registers for sensing and latching a set of status signals 92 from the read/write path 30. The status signals 92 include the outputs of TTL buffers corresponding to input pads of the flash memory device 310, outputs of the sense amplifiers for the flash cell array 20, page buffer counter outputs, outputs of the comparators in the read/write path 30, and the flash array controller 50 program counter.

The control register circuit 83 contains control registers and circuitry for controlling the read path of the read/write path 30 according to a set of control signals 93. The read path control registers include automatic transition detection interface registers, sensing interface registers, x, y, and z path interface registers.

The control register circuit 84 contains registers for controlling a set of test modes of the page buffer circuit 70. The control registers in the control register circuit 84 generate a set of test mode test mode control signals 94. The control registers in the control register circuit 84 are programmed over the central control bus 100 by the flash array controller 50 or the interface circuit 40.

The control register circuit 85 contains registers for controlling special test features of the flash memory device 310 according to a set of control signals 95. The special test registers include test mode access registers, VPP capture registers, ready and busy modifier registers, and address allocation registers.

The interface circuit 40 controls an input address multiplexer 35 to select an input address 36 for the read/write path 30. The selected input address 36 is either the address sensed by TTL buffers (not shown) on the user address bus 102, or the address on a queue address bus 37 from the interface circuit 40. The input address 36 may be overridden by programming control registers over the central control bus 100.

The interface circuit 40 controls an output data multiplexer 45 to select a source for output data transfer over the user data bus 104. The selected output data is either flash array data 46 from the read/write path 30, page buffer data 47 from the page buffer circuit 70, or status register data 48 from a set of status registers contained within the interface circuit 40.

An input control pin for the flash memory device 310 indicates whether the user data bus 104 is eight bits wide or sixteen bits wide. The interface circuit 40 senses a state of the input control pin to determine whether the flash memory device 310 is in an eight bit mode or a sixteen bit mode.

The CPU 302 reads the flash cell array 20 by transferring addresses over the user address bus 102 while signaling read cycles over the user control bus 106. The interface circuit 40 detects the read cycles and causes the input address multiplexer 35 to transfer the addresses from the user address bus 102 through to the x and y decode circuitry of the read/write path 30. The interface circuit 40 also causes the output data multiplexer 45 to transfer the addressed read data from the read/write path 30 over the user data bus 104.

The CPU 302 writes data to the flash cell array 20 by generating write cycles over the host bus 306 to transfer program commands and data to the interface circuit 40. The interface circuit 40 verifies the program commands, and queues the program commands and address and data parameters to the flash array controller 50. The flash array controller 50 performs the program operation by programming the specified data into the flash array 20 at the specified address.

The CPU 302 optionally writes data to the flash cell array 20 by generating write cycles over the host bus 306 to transfer program data to the page buffer circuit 70. The CPU 302 then transfers a program with page buffer command to the interface circuit 40. The interface circuit 40 verifies the program with page buffer command, and queues the program with page buffer command to the flash array controller 50. The flash array controller 50 executes the program with page buffer command by reading the program data from the page buffer circuit 70 and programming the program data into the flash array 20.

The page buffer circuit 70 is comprised of two separate 256 by 8 bit static random access memory (SRAM) planes. The two SRAM planes are comprised of a page plane 0 and a page plane 1. The interface circuit 40 allocates the page plane 0 and page plane 1 page buffer resources to user commands processed by the flash array controller 50. The interface circuit 40 also allocates the page planes 0 and 1 to user access. The page planes 0 and 1 are also referred to as limited resources.

The interface circuit 40 contains 32 block status registers along with 2 global status registers. Each block status register corresponds to one of the blocks of the flash cell array 20. The flash array controller 50 maintains status bits in the block status registers and the global status registers to indicate the status of each block of the flash cell array 20. The CPU 302 reads the contents of the global and block status registers over the host bus 306.

Figure 3:
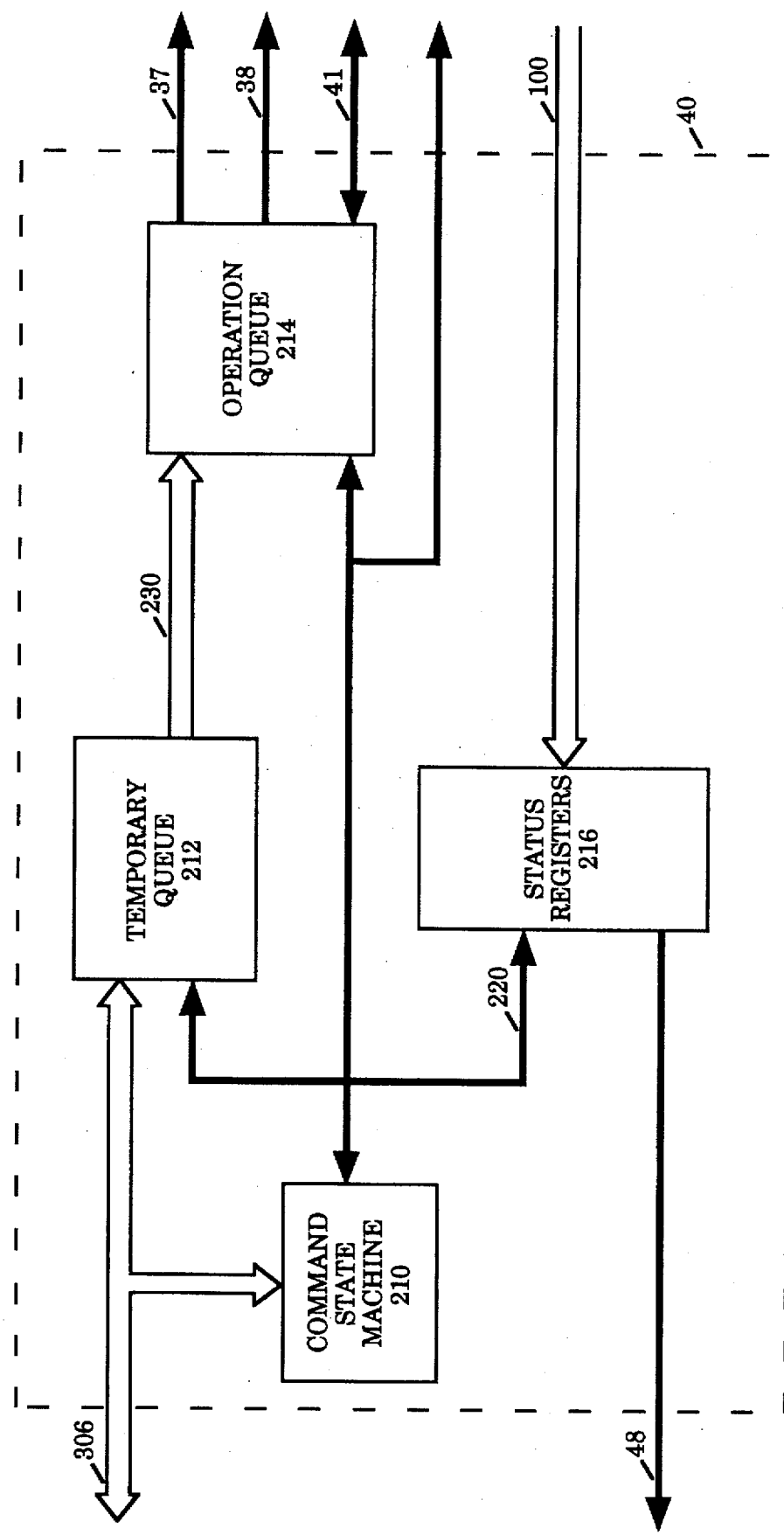
FIG. 3 is a block diagram of the interface circuit comprising a command state machine, a temporary queue, an operation queue, and a set of status registers.

FIG. 3 is a block diagram of the interface circuit 40. The interface circuit 40 is comprised of a command state machine 210, a temporary queue circuit 212, an operation queue circuit 214, and a status register circuit 216.

The interface circuit 40 receives user commands from the CPU 302 over the host bus 306. The user commands comprise user commands for programming the flash array 20, user commands for reading the status registers of the status register circuit 216, and user commands for controlling the access modes of the page buffer circuit 70.

The command state machine 210 receives and verifies each user command. A user command is either processed directly by the command state machine 210 or by the flash array controller 50 according to the function specified by the user command. If the user command requires processing by the flash array controller 50, then the command state machine 210 generates control signals over the command bus 220 to transfer an offset for the user command, along with associated parameters for the user command to the flash array controller 50 through the temporary queue circuit 212 and the operation queue circuit 214.

The command state machine 210 processes read status register user commands. The read status register user command includes a 5 bit BSR address for selecting the 32 block status registers in the status register circuit 216.

The command state machine 210 transfers the BSR address over the command bus 220 to select the block status registers of the status register circuit 216. The contents of the selected block status register are transferred from the status register circuit 216 to the output multiplexer 45 over the status register data bus 48. The command state machine 210 causes the output multiplexer 45 to transfer the status register read data on the status register data bus 48 over the user data bus 104.

The status register circuit 216 contains a block status register for each of the flash array blocks of the flash array 20. Each block status register in the status register circuit 216 stores status bits that provide block specific status information to the user.

The flash array controller 50 maintains the status bits in the block status registers of the status register circuit 216.

The flash array controller 50 accesses the block status registers of the status register circuit 216 over the central control bus 100. The flash array controller 50 performs both reads and writes to the status register circuit 216 over the central control bus 100.

The user commands specifying program or erase operations for the flash array 20 are processed by the flash array controller 50. The command state machine 210 receives and verifies the program and erase user commands, and generates control signals over the command bus 220 to load the user commands and associated address and data parameters into the temporary queue circuit 212.

The command state machine 210 also generates a set of limited resources control bits for each user command transferred to the temporary queue circuit 212. The command state machine 210 transfers the limited resource control bits to the temporary queue circuit 212 over the command bus 220. The limited resource control bits define the allocation of page buffers of the page buffer circuit 70 to the user commands.

The temporary queue circuit 212 stores a temporary queue entry. The temporary queue entry includes a user command, the address and data parameters for the user command, as well as the limited resource control bits allocated to the flash array controller 50 for processing the user command.

The operation queue circuit 214 contains a set of operation queue slots. Each operation queue slot holds a queue offset corresponding to a user command, a queue address corresponding to the user command, and queue data corresponding to the user command, as welt as the limited resource control bits allocated to the user command by the command state machine 210.

The temporary queue circuit 212 transfers the queue offset corresponding to the user command, and the associated parameters from the temporary queue entry into an available queue slot of the operation queue circuit 214 over a temporary queue bus 230. The temporary queue circuit 212 holds the temporary queue entry until a queue slot is available in the operation queue circuit 214.

The flash array controller 50 selects a queue slot from the operation queue circuit 214 by transferring a set of operation queue control signals over the control bus 41. The operation queue control signals cause the operation queue circuit 214 to transfers a queue address from the selected queue slot over the queue address bus 37, and to transfer queue data from the selected operation queue slot over the queue data bus 38. The operation queue control signals also cause the operation queue circuit 214 to transfer a queue offset from the selected operation queue slot over the control bus 41.

Figure 4:
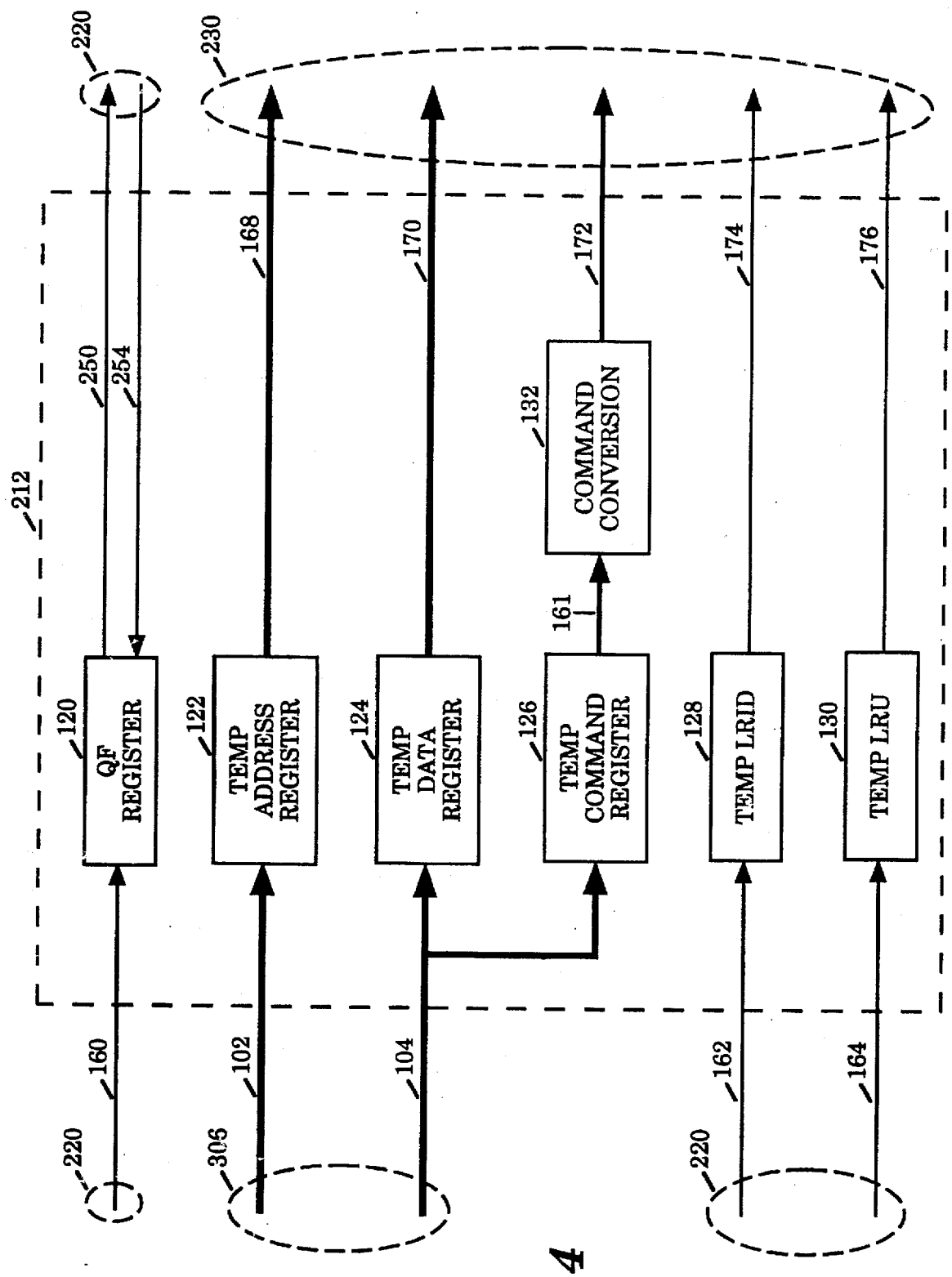
FIG. 4 illustrates the temporary queue circuit which stores a temporary queue entry comprising an address queue, a data queue, an offset queue, and a limited resource bit queue.

FIG. 4 illustrates the temporary queue circuit 212. The temporary queue circuit 212 stores a temporary queue entry in a temporary address register 122, a temporary data register 124, a temporary command register 126, a temporary limited resources ID (LRID) register 128, and a temporary limited resources used (LRU) register 130.

A queue full register 120 receives a temporary queue strobe signal 160 from the command state machine 210 over the command bus 220. The temporary queue strobe signal 160 indicates that the command state machine 210 has received and verified a user command that requires processing by the flash array controller 50. The temporary queue strobe signal 160 causes the queue full register 120 to generate a temporary queue full signal 250.

The command state machine 210 receives the temporary queue full signal 250 over the command bus 220. The temporary queue full signal 250 causes the command state machine 210 to set a queue full status bit in each of the block status registers and global status registers of the status register circuit 216. The queue full status bits block the user from transferring another program or erase user command to the interface circuit 40 until a temporary queue entry is transferred from the temporary queue circuit 212 to an available queue slot in the operation queue circuit 214.

The temporary address register 122 stores a queue address for a temporary queue entry. The temporary address register 122 receives the queue address as a user address over the user address bus 102. The command state machine generates a control signal over the command bus 220 to synchronize loading of the temporary address register 122.

The temporary data register 124 stores queue data for a temporary queue entry. The temporary data register 124 receives the queue data as user data over the user data bus 104. The command state machine generates a control signal over the command bus 220 to synchronize loading of the temporary data register 124.

The temporary command register 126 stores a user command received over the user data bus 104. The command state machine generates a control signal over the command bus 220 to synchronize loading of the temporary command register 126.

The command state machine 210 generates an LRU signal 164 and an LRID signal 162 for the user command stored in the temporary command register 126. The command state machine 210 tracks the allocation of the page buffer resources to the flash array controller 50 to determine available page planes. The LRU signal 164 indicates whether the corresponding user command is allocated a page buffer resource by the command state machine 210. The LRID signal 162 indicates the page buffer resource (page plane 0 or page plane 1) allocated to the corresponding user command.

The temporary LRID register 128 receives the LRID signal 162, and stores an LRID bit for a temporary queue entry. The temporary LRU register 130 receives the LRU signal 164, and stores an LRU bit for a temporary queue entry. The LRID bit and the LRU bit comprise the limited resources control bits for the temporary queue entry.

The command conversion circuit 132 receives a user command 161 from the temporary command register 126. The command conversion circuit 132 generates a queue offset 172 for the temporary queue entry. The command conversion circuit 132 generates the queue offset 172 by mapping the 8 bit user command 161 into one of 32 code storage addresses for the flash array controller 50. The queue offset 172 specifies one of the first 32 entries of code storage for the flash array controller 50.

The temporary queue circuit 212 transfers a temporary queue entry to the operation queue circuit 214 over the temporary queue bus 230. The temporary queue entry comprises a temporary queue address 168, a temporary queue data value 170, a temporary queue offset 172, a temporary queue LRID 174, and a temporary queue LRU 176. The temporary queue entry on the temporary offset bus 230 is stored in the operation queue circuit 214 when a queue slot is available.

The queue full register 120 receives a reset temporary queue signal 254 from the operation queue circuit 214 over the command bus 220. The reset temporary queue signal 254 causes the queue full register 120 to reset the temporary queue full signal 250 after a temporary queue entry is stored in a queue slot of the operation queue circuit 214. The reset temporary queue full signal 250 causes the command state machine 210 to clear the queue full status bits in each of the block status register of the BSR circuit 216 to enable transfer of another program or erase user command to the interface circuit 40.

Figure 5:
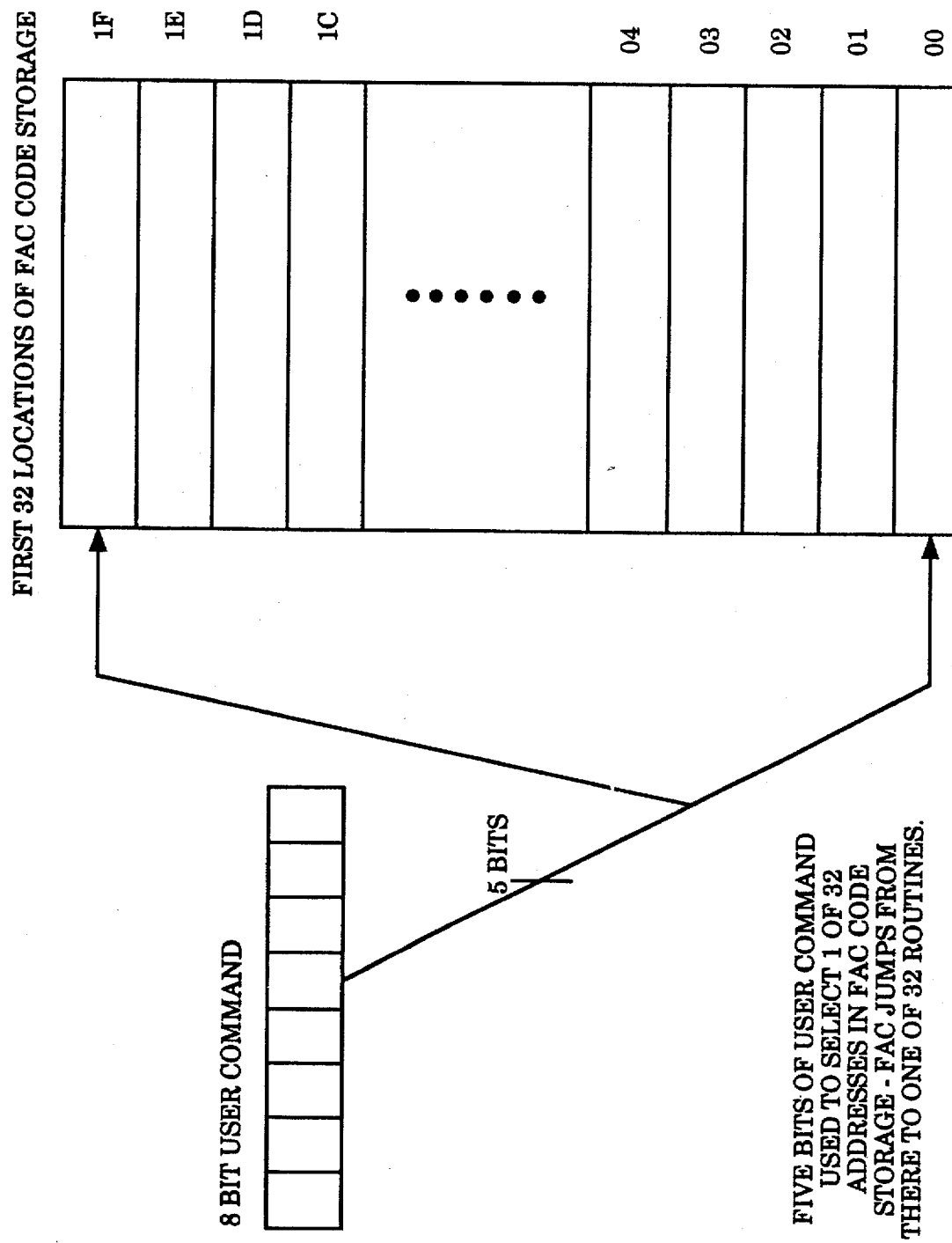
FIG. 5 illustrates the function of the command conversion circuit which receives an eight bit user command from the temporary command register and generates the five bit offset queue.

FIG. 5 illustrates the function of the command conversion circuit 132. The command conversion circuit 132 receives an eight bit user command 161 from the temporary command register 126. The command conversion circuit 132 generates the five bit offset queue 172. The offset queue 172 specifies an entry in the first thirty two locations of code storage for the flash array controller 50. The flash array controller 50 accesses jump vectors from the first thirty two locations of code storage to dispatch to one of thirty two routines for processing the operations specified by user commands.

For one embodiment, the flash array controller 50 processes 128 different user commands specified by the 8 bit user command stored in the temporary command register 126. The command conversion circuit 132 maps the 128 user commands processed by the flash array controller 50 into 32 queue offsets, such that each queue offset corresponds to four user commands.

The four user commands for each queue offset define four classes of user commands processed by the flash array controller 50. The four classes comprise a two cycle without page buffer command, a two cycle with page buffer command, a three cycle without page buffer command, and a three cycle with page buffer command.

Figure 6:
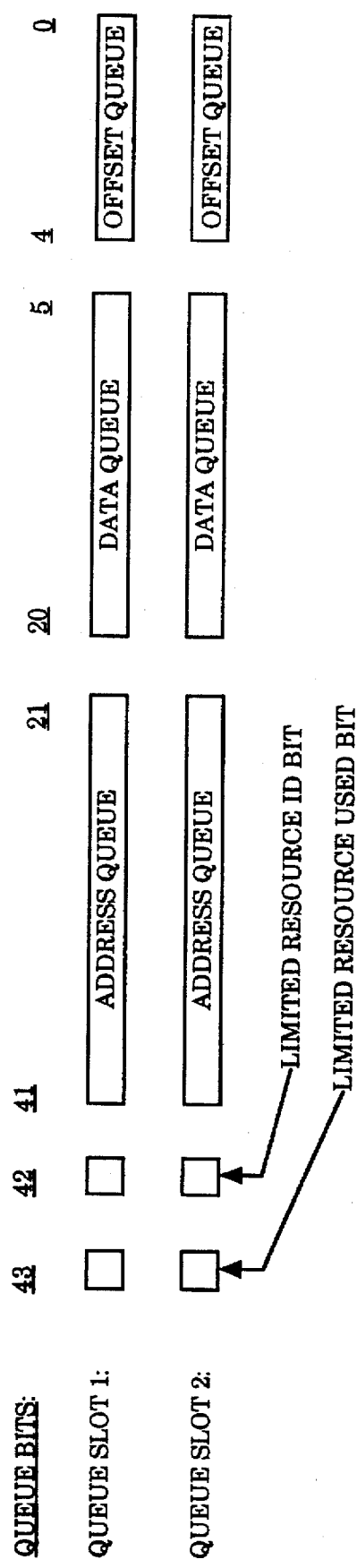
FIG. 6 illustrates the format of queue slots in the operation queue, wherein the queue slots hold a primary queue operation and a secondary queue operation for the flash array controller.

FIG. 6 illustrates the format of the queue slots in the operation queue circuit 214. For one embodiment, the queue slots in the operation queue circuit 214 comprise a queue slot 1 and a queue slot 2. The queue slot 1 holds a primary queue operation for the flash array controller 50 and the queue slot 2 holds a secondary queue operation for the flash array controller 50.

Bits 0-4 of each queue slot holds the offset queue for the corresponding user command. The offset queue in each queue slot is generated by the command conversion circuit 132 according to the user command. Bits 5-20 of each queue slot holds a data queue value. Bits 21-41 of each queue slot holds an address queue value. Bits 42 and 43 of each queue slot hold the limited resources status bits.

Figure 7:
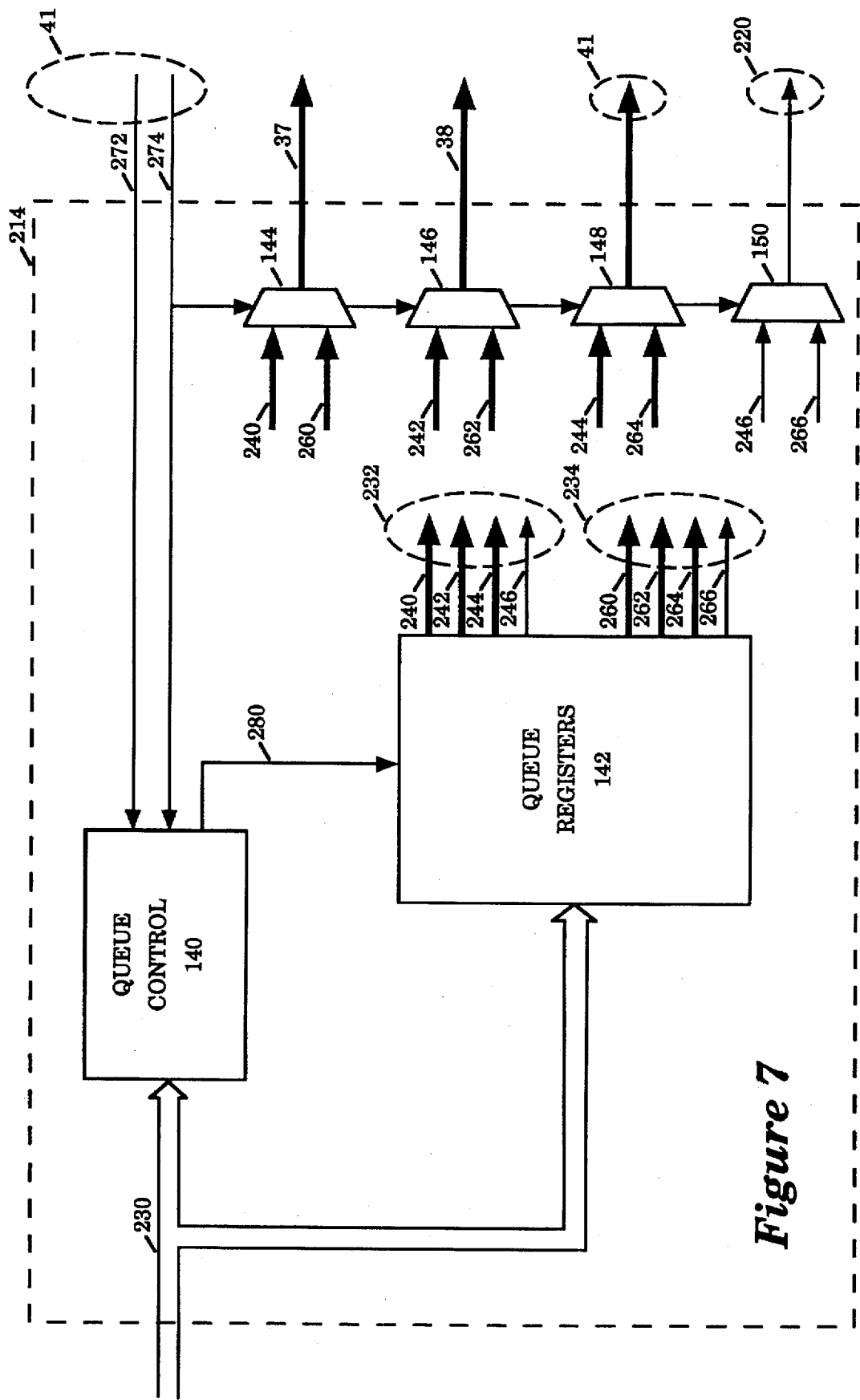
FIG. 7 illustrates the operation queue circuit which contains the queue slots for the primary and secondary queue operations.

FIG. 7 illustrates the operation queue circuit 214. The operation queue circuit 214 is comprised of a queue control circuit 140, a queue register circuit 142, and a set of multiplexers 144-150. The queue register circuit 142 contains the queue slots for the primary and secondary queue operations. The queue control circuit 140 routes temporary queue entries received from the temporary queue circuit 212 into an available queue slot.

The queue control circuit 140 and the queue register circuit 142 receive a temporary queue entry from the temporary queue circuit 212 over the temporary queue bus 230. The queue control circuit 140 determines whether a queue slot is available in the queue register circuit 142. The queue control circuit 140 then generates a set of control signals 280 to route the temporary queue entry received over the temporary queue bus 230 into an available queue slot.

The queue control circuit 140 uses an FAC done signal 272 and a queue operation select signal 274 to determine whether a queue slot is available in the queue register circuit 142. The queue control circuit 140 receives the FAC done signal 272 and the queue operation select signal 274 from the flash array controller 50 over the FAC control bus 41. The FAC done signal 272 indicates that the flash array controller 50 has completed an operation specified in the queue register circuit 142. The queue operation select signal 274 indicates whether the flash array controller 50 is receiving an operation from the primary queue slot or the secondary queue slot.

The FAC done signal 272 indicates to the queue control circuit 140 that a queue slot is available in the queue register circuit 142. The queue operation select signal 274 indicates to the queue control circuit 140 whether the primary or the secondary queue slot is available. The queue control circuit 140 generates the control signals 280 to route the temporary queue entry on the temporary queue bus 30 into the queue slot specified by the queue operation select signal 274.

The queue register circuit 142 transfers the queue slot information for the primary queue operation over a primary queue bus 232. The primary queue bus 232 comprises a primary queue address 240, a primary queue data 42, a primary queue offset 244, and a primary queue LR 246. The primary queue address 240 carries the user address from the primary address queue, the primary queue data 242 carries the user data from the primary data queue, the primary queue offset 244 carries the offset from the primary offset queue, and the primary queue LR 246 carries the LR bits from the primary queue.

The queue register circuit 142 transfers the queue slot information for the secondary queue operation over a secondary queue bus 234. The secondary queue bus 234 comprises a secondary address 260, a secondary data 262, a secondary offset 264, and a secondary LR 266. The secondary queue address 260 carries the user address from the secondary address queue, the secondary queue data 262 carries the user data from the secondary data queue, the secondary queue offset 264 carries the offset from the secondary offset queue, and the secondary queue LR 266 carries the LR bits from the secondary queue.

The multiplexers 144-150 selectively couple the primary queue operation on the primary queue bus 232 and the secondary queue operation on the secondary queue bus 234 to the flash array controller 50 and the read/write path 30.

The multiplexer 144 selectively couples the primary queue address 240 and the secondary queue address 260 to the queue address bus 37 according to the queue operation select signal 274. The multiplexer 146 selectively couples the primary queue data 242 and the secondary queue data 262 to the queue data bus 38 according to the queue operation select signal 274. The multiplexer 148 selectively couples the primary queue offset 244 and the secondary queue offset 264 to a queue offset bus 160 according to the queue operation select signal 274. The queue offset on the queue offset bus 160 is transferred to the flash array controller 50.

The multiplexer 150 selectively couples the primary queue LR 246 and the secondary queue LR 266 to a set of limited resources control signals 162. The limited resources control signals 162 are transferred to the page buffer circuit 70 over the command bus 220. The limited resources control signals 162 determine the allocation of page buffer resources plane 0 and plane 1 in the page buffer circuit 70.

The command state machine 210 generates an FAC run signal 270. The FAC run signal 270 is transferred to the flash array controller 50 over the FAC control bus 41. The FAC run signal 270 causes the flash array controller 50 to process an operation from the primary or secondary operation queue.

Figure 8:
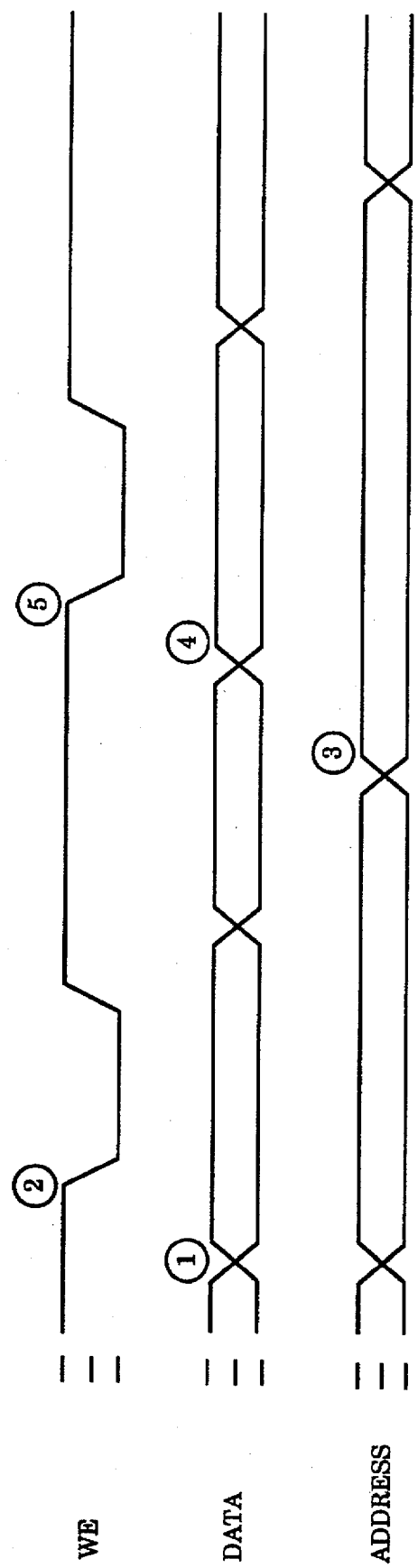
FIG. 8 illustrates the timing of a program byte operation in eight bit mode to the flash memory device.

FIG. 8 illustrates the timing of a program byte operation in eight bit mode to the flash memory device 310. An input control pin for the flash memory device 310 indicates whether the data bus 104 is eight bits wide or sixteen bits wide. The command state machine 210 senses a state of the input control pin to determine whether the flash memory device 310 is in the eight bit mode or a sixteen bit mode.

At time 1, the CPU 302 transfers the command code for a program byte operation over the user data bus 104. At time 2, the CPU 302 asserts the write enable (WE) signal over the user control bus 106. The write enable signal indicates a user command is being transferred on the user data bus 104. The command state machine 210 receives the user command and transfers control signals to the temporary queue circuit 212 to latch the user command code into the temporary command register 126.

At time t3, the CPU 302 transfers an address for the program byte operation over the user address bus 102. At time t4, the CPU 302 transfers the 8 bit data for the program byte operation over the user data bus 104. Thereafter, at time t5 the CPU 302 asserts write enable signal over the user control bus 106. The command state machine 210 senses the write enable signal at time t5, and generates control signals over the command bus 220 to latch the address into the temporary address register 122 and the 8 bit data into the temporary data register 124. The queue full register 120 then generates a temporary queue full signal 250, and the command state machine 210 generates the FAC run signal 270 to startup the flash array controller 50.

Thereafter, if either the primary queue slot or the secondary queue slot of the queue register circuit 142 is available, the queue control circuit 140 generates the control signals 280 to route the temporary queue entry from the temporary queue circuit 212 into the queue register circuit 142. The queue control circuit 140 then generates the reset temporary queue signal 254 to reset the temporary queue full signal 250, and to enable transfer of another user command into the temporary queue circuit 212. The reset state of the temporary queue full signal 250 causes the command state machine 210 to reset the queue full bits in the block status registers in the BSR 216.

Figure 9:
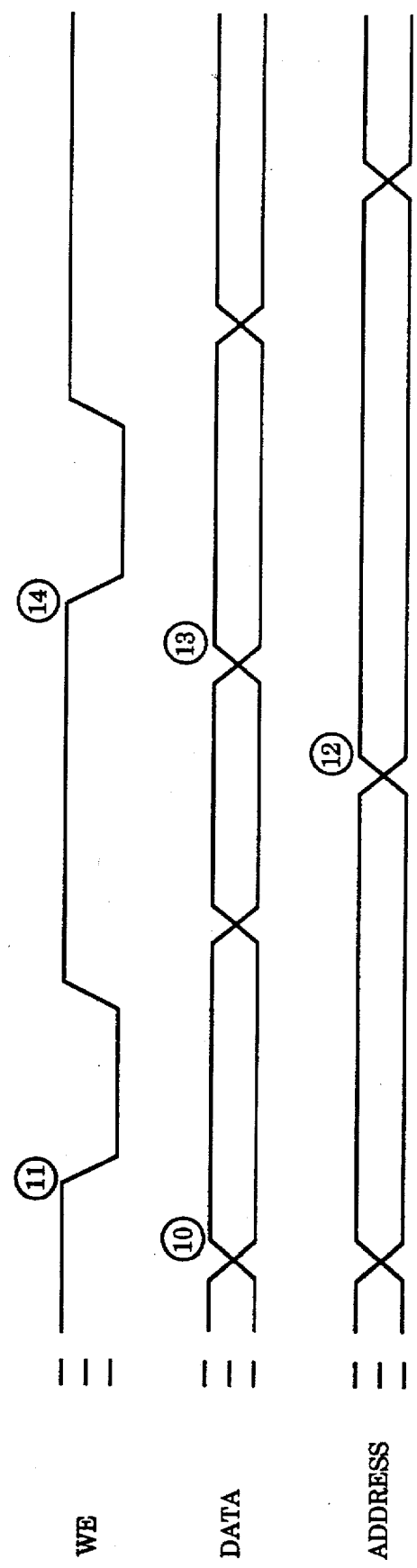
FIG. 9 illustrates the timing of a program word operation in sixteen bit mode to the flash memory device.

FIG. 9 illustrates the timing of a program word operation in sixteen bit mode to the flash memory device 310. At time 10, the CPU 302 transfers the command code for a program word operation over the user data bus 104. At time 11, the CPU 302 asserts the write enable (WE) signal over the user control bus 106. The command state machine 210 receives the user command and transfers control signals to the temporary queue circuit 212 to latch the user command code into the temporary command register 126.

At time t12, the CPU 302 transfers an address for the program word operation over the user address bus 102. At time t13, the CPU 302 transfers the 16 bit data for the program word operation over the user data bus 104. At time t14, the CPU 302 asserts write enable signal over the user control bus 106. The command state machine 210 senses the write enable signal and generates control signals over the command bus 220 to latch the address into the temporary address register 122 and the 16 bit data into the temporary data register 124. The queue full register 120 then generates the temporary queue full signal 250, and the command state machine 210 starts up the flash array controller 50.

Thereafter, if either the primary queue slot or the secondary queue slot of the queue register circuit 142 is available, the queue control circuit 140 generates the control signals 280 to route the temporary queue entry from the temporary queue circuit 212 into the queue register circuit 142. The queue control circuit 140 then generates the reset temporary queue signal 254 to enable transfer of another user command into the temporary queue circuit 212.

Figure 10:
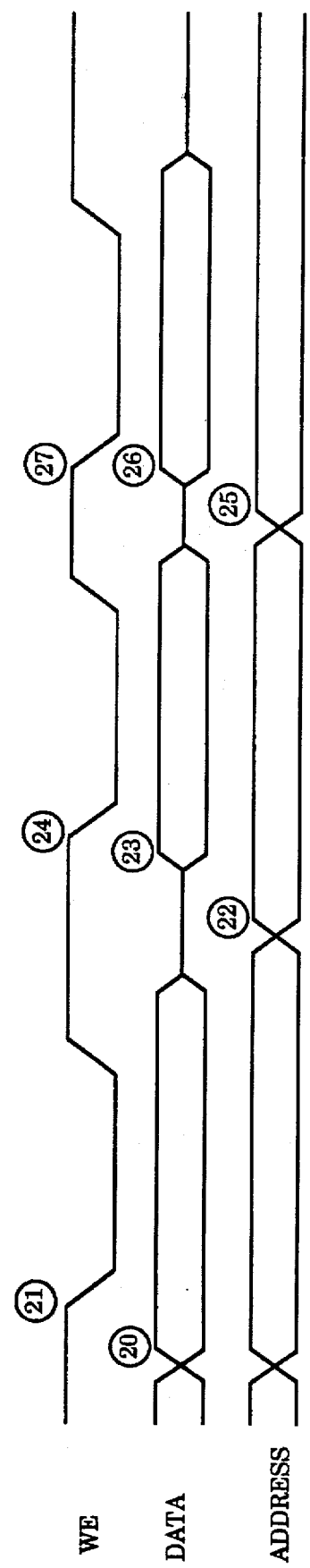
FIG. 10 illustrates the timing of a program word operation in eight bit mode to the flash memory device.

FIG. 10 illustrates the timing of a program 16 bit word operation in eight bit mode to the flash memory device 310. At time 20, the CPU 302 transfers the command code for a program word operation over the user data bus 104. At time 21, the CPU 302 asserts the write enable (WE) signal over the user control bus 106. The command state machine 210 receives the user command and transfers control signals to the temporary queue circuit 212 to latch the user command code into the temporary command register 126.

At time t22, the CPU 302 transfers an address for the high or the low byte of the 16 bit program word over the user address bus 102. The least significant address bit A0 of the user address bus 102 determines whether the high or the low byte is being addressed. At time t23, the CPU 302 transfers the 8 bit high or low data byte for the 16 bit program word over the user data bus 104. At time t24 the CPU 302 asserts write enable signal over the user control bus 106. The command state machine 210 senses the write enable signal and generates control signals over the command bus 220 to latch the address into the temporary address register 122 and the 8 bit high or low data byte into a high or low portion of the temporary data register 124 as selected by the address bit A0.

At time t25, the CPU 302 transfers a full address for the 16 bit program word over the user address bus 102. At time t26, the CPU 302 transfers the remaining 8 bit high or low data byte for the 16 bit program word over the user data bus 104. The temporary queue circuit 212 internally complements the A0 address bit received at time 22 to select the high or the low byte of the temporary data register 124. At time t27, the CPU 302 asserts write enable signal over the user control bus 106. The command state machine 210 senses the write enable signal and generates control signals over the command bus 220 to latch the address into the temporary address register 122 and the 8 bit high or low data byte into a high or low portion of the temporary data register 124 as selected by the internally complemented address bit A0. The queue full register 120 then generates the temporary queue full signal 250, and the command state machine 210 starts up the flash array controller 50.

Thereafter, if either the primary queue slot or the secondary queue slot of the queue register circuit 142 is available, the queue control circuit 140 generates the control signals 280 to route the temporary queue entry from the temporary queue circuit 212 into the queue register circuit 142. The queue control circuit 140 then generates the reset temporary queue signal 254 to enable transfer of another user command into the temporary queue circuit 212.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A flash memory device, comprising:
   interface circuit coupled to receive a user command and a set of command parameters over a bus, said command parameters comprising an address in a flash array of the flash memory device and data, the interface circuit having circuitry that allocates a set of limited resources in the flash memory device and that generates a set of limited resource control bits for the user command, said set of limited resources to process commands issued to the flash memory device; and controller circuit coupled to receive the user command, the command parameters and the limited resource control bits from the interface circuit and having circuitry that performs a program operation specified by the user command on a flash cell array and that also uses the limited resources specified by the limited resource control bits to perform the program operation.

2. The flash memory device of claim 1, wherein the limited resources comprise a page buffer having a set of page planes for buffering data for transfer to the flash cell array during the program operation.

3. The flash memory device of claim 2, wherein the limited resource control bits specify one of the page planes that buffers a write data block that corresponds to the program operation on the flash cell array.

4. The flash memory device of claim 3, wherein the controller circuit accesses the write data block from the page buffer and programs the write data block into the flash cell array during the program operation.

5. The flash memory device of claim 1, wherein the interface circuit is coupled to the controller circuit over a queue bus such that the interface circuit uses the queue bus to queue the user command and the command parameters and the limited resource control bits to the controller circuit.

6. The flash memory device of claim 5, wherein the interface circuit includes an operation queue that buffers the user command and the command parameters and the limited resource control bits for transfer to the controller circuit.

7. The flash memory device of claim 6, wherein the operation queue buffers a primary queue operation and a secondary queue operation, wherein the primary queue operation and the secondary queue operation each comprise an operation address for the flash cell array, an operation data value for programming to the flash cell array, the limited resource control bits, and an operation offset that specifies a controller routine that performs the user command.

8. The flash memory device of claim 7, wherein the controller circuit transfers a queue operation select signal to the interface circuit to select the primary queue operation or the secondary queue operation for transfer over the queue bus.

9. The flash memory device of claim 7, wherein the interface circuit generates the operation offset by mapping the user command into a jump vector that specifies the routine of the controller that processes the user command.

10. The flash memory device of claim 9, wherein the routine for processing the user command processes a plurality of user command classes including a two cycle command class and a three cycle command class.

11. The flash memory device of claim 10, wherein the user command corresponds to the two cycle command class if a data portion of the bus has a first bit width.

12. The flash memory device of claim 11, wherein the user command corresponds to the three cycle command class if the data portion of the bus has a second bit width.

13. A method for processing a user command in a flash memory device comprising a get of limited resources, said method comprising the steps of:
receiving a user command and a set of command parameters over a bus, and determining a set of limited resource control bits for the user command, said command parameters comprising an address in a flash array of the flash memory device and data;
buffering the user command, the command parameters and the limited resource control bits in an operation queue; and
accessing the user command, the command parameters and the limited resource control bits from the operation queue and performing a program operation specified by the user command on a flash cell array using the set of limited resources specified by the limited resource control bits.

14. The method of claim 13, further comprising the step of buffering a write data block for the program operation in a page buffer having a set of page planes.

15. The method of claim 14, wherein the limited resource control bits specify one of the page planes that buffers the write data block that corresponds to the program operation on the flash cell array.

16. The method of claim 15, further comprising the step of accessing the write data block from the page buffer and programming the write data block into the flash cell array during the program operation.

17. The method of claim 13, wherein the step of accessing the user command, the command parameters and the limited resource control bits from the operation queue comprises the step of accessing the user command, the command parameters and the limited resource control bits over a queue bus from the operation queue.

18. The method of claim 17, wherein the operation queue buffers a primary queue operation and a secondary queue operation, wherein the primary queue operation and the secondary queue operation each comprise an operation address for the flash cell array, an operation data value for programming to the flash cell array, the limited resource control bits, and an operation offset that specifies a routine that performs the user command.

19. The method of claim 18, wherein the step of accessing the user command, the command parameters and the limited resource control bits from the operation queue comprises the step of generating a queue operation select signal that selects the primary queue operation or the secondary queue operation for transfer over the queue bus.

20. The method of claim 19, further comprising the step of generating the operation offset by mapping the user command into a jump vector that specifies the routine that processes the user command.

21. The method of claim 20, wherein the routine for processing the user command processes a plurality of user command classes including a two cycle command class and a three cycle command class.

22. The method of claim 21, wherein the user command corresponds to the two cycle command class if a data portion of the bus has a first bit width.

23. The method of claim 22, wherein the user command corresponds to the three cycle command class if the data portion of the bus has a second bit width.

24. An apparatus for processing a user command in a flash memory device comprising a set of limited resources, said apparatus comprising:
means for receiving a user command and a set of command parameters over a bus, and determining a set of limited resource control bits for the user command, said command parameters comprising an address in a flash array of the flash memory device and data;
means for buffering the user command, the command parameters and the limited resource control bits in an operation queue; and
means for accessing the user command, the command parameters and the limited resource control bits from the operation queue and performing a program operation specified by the user command on a flash cell array using the set of limited resources specified by the limited resource control bits.

25. The apparatus of claim 24, further comprising means for buffering a write data block for the program operation in a page buffer having a set of page planes.

26. The apparatus of claim 24, wherein the limited resource control bits specify one of the page planes that buffers the write data block that corresponds to the program operation on the flash cell array.

27. The apparatus of claim 26, further comprising means for accessing the write data block from the page buffer and programming the write data block into the flash cell array during the program operation.

28. The apparatus of claim 24, wherein the means for accessing the user command, the command parameters and the limited resource control bits from the operation queue comprises means for accessing the user command, the command parameters and the limited resource control bits over a queue bus from the operation queue.

29. The apparatus of claim 28, wherein the operation queue buffers a primary queue operation and a secondary queue operation, wherein the primary queue operation and the secondary queue operation each comprise an operation address for the flash cell array, an operation data value for programming to the flash cell array, the limited resource control bits, and an operation offset that specifies a routine that performs the user command.

30. The apparatus of claim 29, wherein the means for accessing the user command, the command parameters and the limited resource control bits from the operation queue comprises means for generating a queue operation select signal that selects the primary queue operation or the secondary queue operation for transfer over the queue bus.

31. The apparatus of claim 30, further comprising means for generating the operation offset by mapping the user command into a jump vector that specifies the routine that processes the user command.

32. The apparatus of claim 31, wherein the routine for processing the user command processes a plurality of user command classes including a two cycle command class and a three cycle command class.

33. The apparatus of claim 32, wherein the user command corresponds to the two cycle command class if a data portion of the bus has a first bit width.

34. The apparatus of claim 33, wherein the user command corresponds to the three cycle command class if the data portion of the bus has a second bit width.

35. A flash memory device, comprising:

page buffer having a set of page planes for buffering data for transfer to a flash cell array during a program operation on the flash cell array;

interface circuit coupled to receive a user command and a set of command parameters over a bus, said command parameters comprising an address in a flash array of the flash memory device and data, the interface circuit having circuitry for generating a set of limited resource control bits that specify one of the page planes for the user command; and controller circuit coupled to receive the user command, the command parameters and the limited resource control bits from the interface circuit and having circuitry that performs the program operation on the flash cell array using one of the page planes specified by the limited resource control bits.

36. The flash memory device of claim 35, wherein one of the page planes specified by the limited resource control bits buffers a write data block that corresponds to the program operation on the flash cell array.

37. The flash memory device of claim 36, wherein the controller circuit accesses the write data block from the page buffer and programs the write data block into the flash cell array during the program operation.

38. The flash memory device of claim 35, wherein the interface circuit is coupled to the controller circuit over a queue bus such that the interface circuit queues the user command and the command parameters and the limited resource control bits to the controller circuit over the queue bus.

39. The flash memory device of claim 38, wherein the interface circuit includes an operation queue that buffers the user command and the command parameters and the limited resource control bits for transfer to the controller circuit.

40. The flash memory device of claim 39, wherein the operation queue buffers a primary queue operation and a secondary queue operation, wherein the primary queue operation and the secondary queue operation each comprise an operation address for the flash cell array, an operation data value for programming to the flash cell array, the limited resource control bits, and an operation offset that specifies a controller routine that performs the user command.

41. A computer system, comprising:

processor coupled to transfer a write data block over a bus and then a user command and a set of command parameters over the bus, said command parameters comprising an address in a flash array of a flash memory device and data;

said flash memory device coupled to the bus and having an interface circuit that generates a set of limited resource control bits for the user command and that includes a page buffer having a set of page planes for buffering the write data block for transfer to a flash cell array during a program operation specified by the user command, the flash memory device also having a controller circuit coupled to receive the user command, the command parameters and the limited resource control bits from the interface circuit and having circuitry that performs the program operation on the flash cell array using one of the page planes specified by the limited resource control bits.

42. The computer system of claim 41, wherein the controller circuit accesses the write data block from the page buffer and programs the write data block into the flash cell array during the program operation.

43. The computer system of claim 42, wherein the interface circuit is coupled to the controller circuit over a queue bus such that the interface circuit queues the user command and the command parameters and the limited resource control bits to the controller circuit over the queue bus.

44. The computer system of claim 43, wherein the interface circuit includes an operation queue that buffers the user command and the command parameters and the limited resource control bits for transfer to the controller circuit.

45. The computer system of claim 44, wherein the operation queue buffers a primary queue operation and a secondary queue operation, wherein the primary queue operation and the secondary queue operation each comprise an operation address for the flash cell array, an operation data value for programming to the flash cell array, the limited resource control bits, and an operation offset that specifies a controller routine that performs the user command.

* * * * *

UNITED STATES PATENT AND TRADEMARK OFFICE
CERTIFICATE OF CORRECTION

PATENT NO. : 5,692,138
DATED : November 25, 1997
INVENTOR(S) : Fandrich et al.

It is certified that error appears in the above-identified patent and that said Letters Patent is hereby corrected as shown below:

In column 7 at line 30 delete "welt" and insert --well--

In column 11 at line 47 delete "lime" and insert --time--

In column 12 at line 1 delete "liming" and insert --timing--

Signed and Sealed this

Tenth Day of March, 1998

Attest:

BRUCE LEHMAN

*Attesting Officer*    *Commissioner of Patents and Trademarks*